United States Patent

Bruees et al.

[11] Patent Number: 5,761,039
[45] Date of Patent: Jun. 2, 1998

[54] ELECTRICAL LOAD SWITCH FOR A MOTOR VEHICLE

[75] Inventors: Heinrich Bruees, Geseke; Petrik Lange, Lippstadt, both of Germany

[73] Assignee: Hella KG Hueck & Co., Lippstadt, Germany

[21] Appl. No.: 659,829

[22] Filed: Jun. 7, 1996

[30] Foreign Application Priority Data

Jun. 19, 1995 [DE] Germany .................. 195 22 126.5

[51] Int. Cl.$^6$ ...................................................... H05K 7/20
[52] U.S. Cl. .......................... 361/704; 361/785; 361/764; 200/51 R; 439/620; 307/9.1
[58] Field of Search .................................. 361/703, 704, 361/709, 710, 717–719, 785, 728, 736, 764; 307/9.1, 10.1; 439/620; 200/51 R

[56] References Cited

U.S. PATENT DOCUMENTS

| | | | |
|---|---|---|---|
| 3,622,949 | 11/1971 | Sorenson | 439/620 |
| 3,750,082 | 7/1973 | Petersen | 439/620 |
| 4,774,434 | 9/1988 | Bennion | 340/825.82 |
| 4,862,311 | 8/1989 | Rust et al. | 361/91 |
| 5,040,097 | 8/1991 | Stribel | 361/684 |
| 5,057,970 | 10/1991 | Chave | 361/722 |
| 5,079,672 | 1/1992 | Haubner | 361/705 |
| 5,139,443 | 8/1992 | Armando | 439/620 |
| 5,159,532 | 10/1992 | Kilian | 361/709 |
| 5,170,322 | 12/1992 | Von Guttenberg | 361/704 |
| 5,461,542 | 10/1995 | Kosak | 361/710 |
| 5,581,130 | 12/1996 | Boucheron | 307/10.1 |

FOREIGN PATENT DOCUMENTS

| | | |
|---|---|---|
| A-2511010 | 9/1976 | Germany. |
| 30 28 178 C 2 | 5/1985 | Germany. |
| U-8908257 | 10/1990 | Germany. |
| WO-A-9113478 | 9/1991 | Germany. |
| 93 07 386 | 10/1993 | Germany. |
| 44 19 005 A 1 | 12/1995 | Germany. |

OTHER PUBLICATIONS

Hans–Dirk Löwe, Michael Kaindl, "Dickschichttechnik mit Diffusion–Patterning–Vias für Multichipmodule" Hybridtechnik, Bd. 8 (1994), Heft 4.

Zettler GmbH, Prospectus, "Halbleiter–Relais", Produkt–Übersicht; das Programm nach Mass Für alle Anwendungsbereiche.

Motorola GmbH, Prospectus, "SSR Solid State Relay; customer reference brochure".

*Primary Examiner*—William M. Shoop, Jr.
*Assistant Examiner*—Peter Ganjian
*Attorney, Agent, or Firm*—Griffin, Butler Whisenhunt & Szipl

[57] ABSTRACT

Electronic load switch has an electronic power switch and a control circuit mounted on a hybrid ceramic. Plug lugs are soldered directly to the hybrid ceramic to form a motor-vehicle-typical plug contact element which is engagement compatible with standard plug-contact elements of electromechanical load switches. The electronic load switch of this invention can therefore, without further expense, replace previous electromechanical load switches.

9 Claims, 2 Drawing Sheets

ELECTRICAL LOAD SWITCH FOR A MOTOR VEHICLE

BACKGROUND OF THE INVENTION

This invention concerns an electronic load switch including at least one semiconductor electronic power switch and an integrated electronic control element, both of which are arranged as circuit parts of a hybrid electronic component on a hybrid ceramic.

Electromechanical load switches (relays) are increasingly being replaced by electronic load switches including circuit apparatus having an electronic semiconductor (transistor, thyristor), an electronic control component and optionally additional wiring with passive components.

The substitution of electromechanical load switches by electronic switches is carried out predominantly by electronic control devices in which the electromechanical load switches are replaced by electronic circuit parts on a circuit board (for example, a printed circuit board).

An electromechanical switch of a motor vehicle, which has a plug contact (i.e. plug) terminal and an encapsulated structure, is an independent component which can be electronically and mechanically coupled via a corresponding opposite plug terminal (i.e. receptacle, or socket), at a desired position in a motor vehicle.

Various types of independent semi-conductor relays are shown on a title page of a prospectus "Halbleiter-Relais, Produkt Übersicht; Das Programm nach Maβ für alle Anwendungsbereiche". (Semiconductor relay Product Overview; The Custom Program For All Areas of Use),10/91, of the Firm Zettler. One of the disclosed structures shows semiconductor relays which are formed as a wired component and can be soldered to a circuit board. In another structure, a housing of a semiconductor relay has two screw clamps by means of which the semiconductor relay can be coupled to electronic leads.

The prospectus "SSR SOLID STATE RELAY, customer reference brochure", 1993 of the firm Motorola, shows an electrical load switch for motor vehicle use in which a load switch is arranged inside a relatively large volume metallic housing whereby a flange-like surface of the housing is provided for coupling with a metal part which functions as a heat sink (for example, a motor block). The electrical connection of this electronic load switch is accomplished via a plurality of flat plug connections.

With these prior-art load switches circuit parts within housings are mounted on electrically insulating carriers (for example, circuit boards or hybrid ceramic plates). Such a structure of a load switch is also described in German Gebrauchsmuster Anmeldung (Industrial Utility Model) Application G93-07386.

All of these electronic load switches are, however, because of their structures, not contact compatible with electromechanical "stand alone" (potted relays) and can, therefore, not replace these, at least not without great additional expense (for example, changing wiring harnesses of motor vehicles).

It is an object of this invention to provide a particularly high-duty electronic load switch that can be manufactured simply, cost effectively and to have a small size, and that is suitable for directly replacing previous electromechanical load switches, that is, without requiring changes in outer wiring of the load switch.

SUMMARY OF THE INVENTION

According to principles of this invention, plug lugs are soldered directly onto a hybrid ceramic so that the plug lugs form plug contact elements typical for motor vehicles so as to be connection compatible with standard plug contact parts for electromechanical load switches.

BRIEF DESCRIPTION OF THE DRAWING

The invention is described and explained in more detail below using the embodiments shown in the drawings. The described and drawn features, in other embodiments of the invention, can be used individually or in preferred combinations. The foregoing and other objects, features and advantages of the invention will be apparent from the following more particular description of a preferred embodiment of the invention, as illustrated in the accompanying drawings in which reference characters refer to the same parts throughout the different views. The drawings are not necessarily to scale, emphasis instead being placed upon illustrating principles of the invention in a clear manner.

DESCRIPTION OF THE PREFERRED EMBODIMENT

Figure 1:
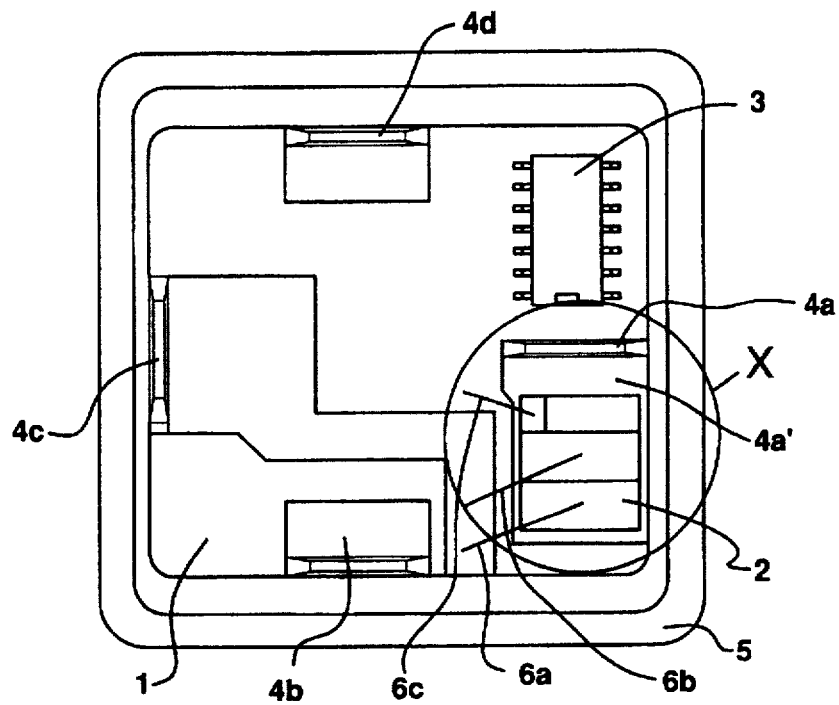
FIG. 1 is a plan view of a representative embodiment of a load switch according to this invention.

FIG. 1 shows a basic structure of an electronic load switch of this invention on a hybrid ceramic, 1. The hybrid ceramic 1 is adhered to an interior surface of a pot-shaped heat sink 5.

Four plug lugs 4a, 4b, 4c, 4d can be seen whose end portions are soldered, by means of a high temperature solder, with solder pads, directly to the hybrid ceramic 1.

A control chip 3 is representative of a control circuit. Further components, such as electrical connections, which relate to the control circuit and which can be arranged on the hybrid ceramic 1 using thick-layer methods, thin-layer methods, or SMD (surface-mounted-device) methods, are not shown for reasons of clarity.

In the circled area X, an electronic power switch 2 can be seen which is soldered to a bent portion 4a' of the plug lug 4a.

From one contact of the electronic power switch 2 extend two leads 6a, 6b to be connected in parallel to a portion of the plug lug 4c, while a further lead 6c extends to a strip conductor, not shown, via which a control terminal of the electronic load switch 2 is coupled to the control circuit 3.

Figure 2:
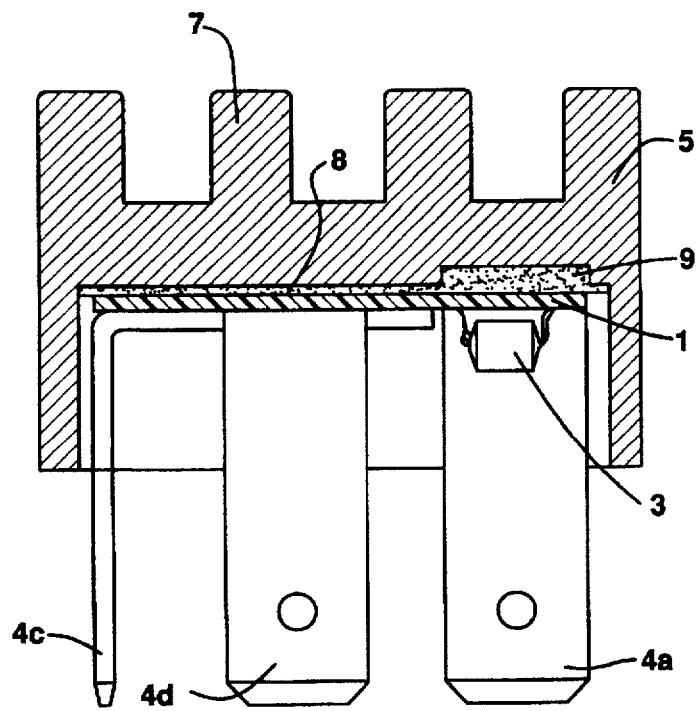
FIG. 2 is a side cross sectional view taken of the embodiment of FIG. 1.

For further clarification, FIG. 2 shows the same electronic load switch in a side cross sectional view. The hybrid ceramic tile 1, the control chip 3, three of the plug lugs 4a, 4c, 4d, as well as the heat sink 5 whose top side preferably has cooling ribs 7 which can be clearly seen.

The hybrid ceramic 1 is mounted to an interior side of the heat sink 5 by means of an adhesive layer 8. In this regard, in an area of the interior surface of the heat sink 5, adjacent the mounting position of the control chip 3, a cavity 9 is formed in the heat sink 5 which is filled with a poor-heat-conductive adhesive when the hybrid ceramic 1 is adhered to the heat sink 5 to thereby protect the control chip 3 from undue heating via the heat sink 5.

Figure 3:
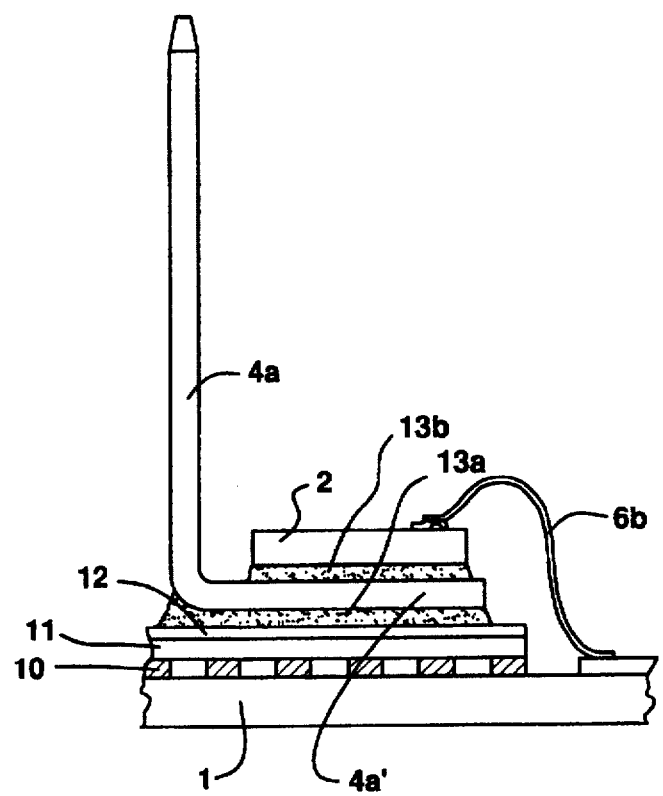
FIG. 3 is a segmented side cross sectional view of a portion of the embodiment depicted in FIG. 1.

In FIG. 3 is shown the elements in the X marked area of FIG. 1 in an enlarged, side view, partially in section.

A step-like structure of the hybrid in the area of the plug lug 4a can be seen. Firstly, a NTC resistor (resistor with negative temperature coefficient) or a PTC resistor (resistor with positive temperature coefficient) is mounted using a thick-layer technique to serve as a temperature sensor 10.

The temperature sensor 10 is covered by an insulating layer 11 on which is located a solder pad 12 of strip-conductor paste.

A high temperature solder layer 13a (of SU-CU or SU-AG Solder) solders the bent portion 4a' of the plug lug 4a to the solder pad 12, the high temperature soldering taking place at a process temperature ≧3000 Celsius. This type of soldering has the benefit that the solder, even at temperatures far above 1000 Celsius, as appear in the area of electronic power switch 2, does not soften.

An upper surface of the bent portion 4a' is coupled to a terminal of the electronic power switch 2 on a broad surface by means high temperature soldering via a further high temperature solder layer 13b. In this manner, a particularly good electrical (little contact transition resistance), and thermal (good heat transmission) connection from the electronic power switch 2 to the plug lug 4a, is created.

The direct soldering of the power switch 2 to the bent portion 4a' of the plug lug 4a, is particularly beneficial because then the power current of the electronic power switch does not have to pass over comparatively high-resistance strip conductors on the hybrid ceramic 1.

Contacts with further terminals of the electronic power switch 2 result via a plurality of bond wires used as connection leads having the largest possible cross section, with one of the leads 6b being represented in FIG. 3.

Figure 4:
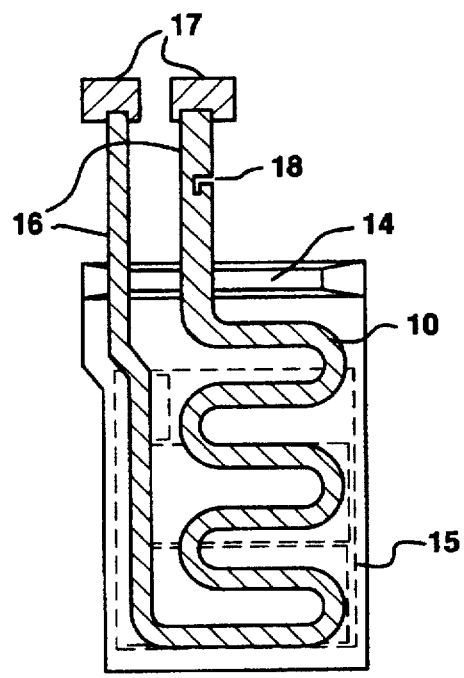
FIG. 4 is a bottom view of the hybrid ceramic arrangement depicted in FIG. 3, but with parts removed for clarity.

FIG. 4. Shows the arrangement depicted in FIG. 3 from the bottom side, that is, seen from the direction of the hybrid ceramic but with the hybrid ceramic being removed, or imagined as being transparent. The meandering structure represents the temperature sensor 10, which is the NTC or PTC resistor in a thick-layer form.

General lines arranged about the temperature sensor 10 show an outer contour 14 of the plug lug 4a. The dashed lines show the outer contour 15 of the power switch arranged on the bent area 4a' of the plug lug 4a. Because of the effective operative position of the temperature sensor 10, it is understandable that the temperature sensor 10 is particularly suitable to detect the temperature of the electronic power switch.

The temperature sensor 10 has an end area 16 which is coupled via strip conductors 17 to the control circuit (not shown). Because these end portions 16 extends freely over the hybrid surface, slits 18 can be made in the end portions, for example by means of a laser beam, for tolerance balancing of the temperature sensor so that the temperature sensor 10 represents an intolerant component.

The electronic load switch described herein can be easily adapted to meet other use requirements, particularly by changing the manner of functioning of the control circuit. Such a particularly beneficial adaptation results, for example, if the electronic load switch is formed as a fully electronic blinker control (flasher), which does not use any electromechanical relays and which because of its compatibly-structured plug contact parts is suitable for replacing an electromechanical blinker control.

Thus, the objects of this invention are met in that the plug lugs are soldered directly to the hybrid ceramic so that the plug lugs form motor-vehicle-typical plug contact parts which are engagement compatible with standard plug contact parts (receptacles) for electromechanical load switches.

An electronic load switch is described in a not yet published German Patent Application DE 44 19 005 which has engagement-compatible motor-vehicle typical plug contact parts for an electromechanical load switch. This device, has instead of a hybrid ceramic, a metallic circuit board which also forms the plug contact parts. Contrary to the above described inventive load switch, this different type prior art load switch has a smaller electrical capacity.

The electronic load switch of this invention has many advantages. In this regard, the electronic load switch of this invention has an uncomplicated structure because the hybrid ceramic mechanically supports, and electrically connects, the electrical power switch and the electronic control elements to one another.

It is also beneficial that the control electronics can be completely formed of a plurality of electronic components, whereby wiring expenses can remain low. Such components can be mounted in a particularly uncomplicated and cost effective manner as surface mounted devices, or using printed circuit techniques, on hybrid ceramic, with the electrical connections between these components being also printed on the hybrid ceramic.

It is particularly beneficial that the contact plugs are soldered by means of a high temperature soldering directly onto the hybrid ceramic, which represents a particularly uncomplicated mounting technique for mounting the contact plugs.

Further, in this manner, particularly good electrical coupling of the contact plugs to the circuit-carrier-functioning hybrid ceramic can also be achieved because the plug lugs can have quite large surfaces soldered to the hybrid ceramic so that the electrical contact transition resistance is quite small. Simultaneously, a further benefit that is thereby achieved is also a quite good thermal coupling between the hybrid ceramic and the plug lugs.

The plug lugs function in this regard first as a heat sink in that they accept heat passed to the hybrid ceramic. This received heat is then conducted by the plug lugs over their opposite plug contact parts (socket) into the wiring harness of the motor vehicle.

A particular benefit is also thereby achieved in that the plug lugs are soldered to the hybrid ceramic so as to form motor-vehicle-typical plug contact elements which are engagement compatible with standard plug contact elements of electromechanical load switches. In this manner, electromechanical load switches in motor vehicles can be replaced by electronic load switches of this invention without further expense because the electronic load switches of this invention can be inserted in already available opposite plug contact elements for the electromechanical load switches. The electronic load switch of this invention works, contrary to electromechanical load switches, even under extreme operating conditions, completely wear free.

Further beneficial embodiments and further structures of an electronic load switch of this invention are possible.

Thus, it is particularly beneficial to solder a terminal of the power switch directly to a portion of a plug lug. In this manner, heat which appears on the electronic power switch directly reaches, without difficulty via the hybrid, the plug lug and is from there directly transmitted, via the opposite plug contact element, to the wiring harness. Thus, heat dissipation of the load switch is markedly improved in an uncomplicated manner.

It is further beneficial, to provide a temperature sensor below this plug lug, on which the electronic power switch is soldered which senses the temperature in the area of the power switch and turns off the power switch via control electronics in case of an over temperature, and thereby prevents destruction because of an overload.

NTC and PTC resistance temperature sensors can be beneficially provided by printing them, for example, as thick layer elements on the hybrid ceramics.

In this manner, the temperature sensor can be of a large surface type which enables a quite exact detection of the temperature for the power switch. In this regard, it is particularly beneficial if the temperature sensor has a portion which extends from below (or adjacent) the plug lug. In this portion, the temperature sensor on an already-mounted load switch can be easily calibrated, for example, by means of a laser beam.

By accomplishing this, the temperature sensor is made as a not particularly tolerant component so that an overtemperature shutting down of the power switch caused by the temperature sensor is carried out with exactness.

To accomplish this, on the other hand, power performance of the power switch can be exploited to its outer limits without fear of destroying the power switch. Thus, the entire load switch provides a particularly efficient component.

It is also particularly beneficial to mount the hybrid ceramic on an interior surface of a pot-shaped metallic heat sink which also forms a housing of the electronic load switch. In this manner, a particularly compact structure for the load switch is made possible which is superior in compactness to that of a comparable electromechanical load switch.

Further, a cavity is beneficially provided adjacent a semiconductor or chip of control electronics, between the hybrid ceramic and the heat sink. This cavity is covered with a poor heat conducting adhesive when the hybrid ceramic is mounted on the heat sink surface. Thereby, effectively, a thermal feedback between the chip or semiconductor of the control electronics, and the electrical power switch is avoided.

By use of suitable embodiments of the control circuit the electronic load switch can, in an uncomplicated manner, be constructed as an electronic flasher for blinkers so that the power switch directly controls, that is without an intervening circuit, an electromechanical relay of blinker lamps.

While the invention has been particularly shown and described with reference to a preferred embodiment, it will be understood by those of ordinary skill in the art that various changes in form and detail may be made therein without departing from the spirit and scope of the invention.

The invention claimed is:

1. Electronic load switch for a motor vehicle including at least one semiconductor electronic switch and an integrated control circuit as circuit elements of a hybrid circuit arranged on a hybrid ceramic, wherein:

plug lugs are soldered directly to the ceramic tile so that the plug lugs form typical motor-vehicle-type plug contact elements which are contact compatible with standard sockets for electromechanical load switches;
wherein a terminal of the electronic power switch is soldered directly to a portion of a plug lug; and
wherein a temperature sensor is arranged on the hybrid ceramic, between the hybrid ceramic and the portion of the plug lug to which the terminal of the electric power switch is directly soldered.

2. Electronic load switch as in claim 1 wherein the temperature sensor is one of a NTC and a PTC resistor.

3. Electronic load switch as in claim 1 wherein the temperature sensor is formed by thick-layer printing techniques.

4. Electronic load switch as in claim 1 wherein the temperature sensor has the largest possible surface area.

5. Electronic load switch as in claim 1 wherein an end portion of the temperature sensor extends beyond a flat contour of the plug lug to which the terminal of the electric sower switch is directly soldered.

6. Electronic load switch as in claim 1 wherein the temperature sensor turns off the electronic power switch in response to a pre-planned temperature value being exceeded.

7. Electronic load switch as in claim 1 wherein the hybrid ceramic is mounted on an interior surface of a pot-shaped heat sink.

8. Electronic load switch as in claim 7 wherein a cavity is provided between the hybrid ceramic and an interior surface of the heat sink adjacent a solid-state electronic element of the control circuit.

9. Electronic load switch as in claim 1 wherein the control circuit is integrated with a counter and the electronic load switch is an electronic flasher for a blinker system.

* * * * *